US008862652B2

(12) United States Patent
Drane

(10) Patent No.: US 8,862,652 B2
(45) Date of Patent: Oct. 14, 2014

(54) METHOD AND APPARATUS FOR PERFORMING LOSSY INTEGER MULTIPLIER SYNTHESIS

(75) Inventor: Theo Alan Drane, London (GB)

(73) Assignee: Imagination Technologies, Limited, Imagination House, Home Park Estate, Kings Langley, Hertfordshire (GB)

( * ) Notice: Subject to any disclaimer, the term of this patent is extended or adjusted under 35 U.S.C. 154(b) by 274 days.

(21) Appl. No.: 13/537,527

(22) Filed: Jun. 29, 2012

(65) Prior Publication Data

US 2013/0007085 A1    Jan. 3, 2013

(30) Foreign Application Priority Data

Jun. 30, 2011 (GB) .................................. 1111243.0

(51) Int. Cl.
*G06F 7/38* (2006.01)
*G06F 17/50* (2006.01)
*G06F 7/53* (2006.01)

(52) U.S. Cl.
CPC ................................. *G06F 17/5045* (2013.01); *G06F 7/5318* (2013.01)
USPC ........................................................ 708/551

(58) Field of Classification Search
CPC ... G06F 7/49947; G06F 7/48; G06F 7/49963; G06F 7/49952; G06F 7/5443
USPC ........................................................ 708/551
See application file for complete search history.

(56) References Cited

U.S. PATENT DOCUMENTS 8,336,007 B1 * 12/2012 Dupenloup .................... 716/103
8,381,154 B2 * 2/2013 Drane .............................. 716/110

OTHER PUBLICATIONS

"Analytical Calculation of the Maximum Error for a Family of Truncated Multipliers Providing Minimum Mean Square Error"Garofalo Journal of Latex Class Files vol. 6, No. 1 Jan. 2007.
"Data-dependent truncation scheme for parallel multipliers" Signals, Systems & Computers, 1997. Conference Record of the Thirty-First King, E.J.
Area-Efficient Multipliers for Digital Signal Processing Applications Kidambi IEEE Trans. on Circuits and Systems vol. 43, No. 2 Feb. 96.
Carry Prediction and Selection for Truncated Multiplication Michard Signal Processing Systems Design and Implementation, 2006. SIPS '06.
Hou-Jen Ko; Shen-Fu Hsiao; , "Design and Application of Faithfully Rounded and Truncated Multipliers With Combined Deletion, Reduction, Truncation, and Rounding," Circuits and Systems II: Express Briefs, IEEE Transactions on , vol. 58, No. 5, pp. 304-308, May 2011 doi: 10.1109/TCSII.2011.2148970.

(Continued)

*Primary Examiner* — Tan V. Mai
(74) *Attorney, Agent, or Firm* — Michael S. Garrabrants

(57) ABSTRACT

A method is provided for deriving an RTL a logic circuit performing a multiplication as the sum of addends operation with a desired rounding position. In this, an error requirement to meet for the design rounding position is derived. For each of the CCT and the VCT implementation a number columns to discard is derived and a constant to include in the sum addends. For an LMS implementation, a number of columns to discard is derived. After discarding the columns and including the constants as appropriate, an RTL representation of the sum of addends operation is derived for each of the CCT, VCT and LMS implementations and a logic circuit synthesized for each of these. The logic circuit which gives the best implementation is selected for manufacture.

20 Claims, 3 Drawing Sheets

(56) References Cited

OTHER PUBLICATIONS

Hyuk Park; Swartzlander, E.E.; , "Truncated Multiplications for the Negative Two's Complement Number System," Circuits and Systems, 2006. MWSCAS '06. 49th IEEE International Midwest Symposium on , vol. 2, no., pp. 428-432, Aug. 6-9, 2006 doi: 10.1109/MWSCAS.2006.382304.

Juang, T.-B.; Shen-Fu Hsiao; , "Low-error carry-free fixed-width multipliers with low-cost compensation circuits," Circuits and Systems II: Express Briefs, IEEE Transactions on , vol. 52, No. 6, pp. 299-303, Jun. 2005 doi: 10.1109/TCSII.2005.848956.

Petra, N.; De Caro, D.; Garofalo, V.; Napoli, E.; Strollo, A.G.M.; , "Design of Fixed-Width Multipliers With Linear Compensation Function," Circuits and Systems I: Regular Papers, IEEE Transactions on , vol. 58, No. 5, pp. 947-960, May 2011 doi: 10.1109/TCSI.2010.2090572.

Petra, N.; De Caro, D.; Garofalo, V.; Napoli, E.; Strollo, A.G.M.; , "Truncated Binary Multipliers With Variable Correction and Minimum Mean Square Error," Circuits and Systems I: Regular Papers, IEEE Transactions on , vol. 57, No. 6, pp. 1312-1325, Jun. 2010 doi: 10.1109/TCSI.2009.2033536.

Sang-Min Kim; Jin-Gyun Chung; Parhi, K.K.; , "Low error fixed-width CSD multiplier with efficient sign extension," Circuits and Systems II: Analog and Digital Signal Processing, IEEE Transactions on , vol. 50, No. 12, pp. 984-993, Dec. 2003 doi: 10.1109/TCSII.2003.820231.

Schulte, M.J.; Swartzlander, E.E., Jr.; , "Truncated multiplication with correction constant [for DSP]," VLSI Signal Processing, VI, 1993., [Workshop on] , vol., no., pp. 388-396, Oct. 20-22, 1993 doi: 10.1109/VLSISP.1993.404467.

Stine, J.E.; Duverne, O.M.; , "Variations on truncated multiplication," Digital System Design, 2003. Proceedings. Euromicro Symposium on , vol., no., pp. 112-119, Sep. 1-6, 2003 doi: 10.1109/DSD.2003.1231908.

Strollo, A.G.M.; Petra, N.; DeCaro, D.; , "Dual-Tree Error Compensation for High Performance Fixed-Width Multipliers," Circuits and Systems II: Express Briefs, IEEE Transactions on , vol. 52, No. 8, pp. 501-507, Aug. 2005 doi: 10.1109/TCSII.2005.848979.

Truncated Binary Multipliers with Minimum Mean Square error: Analytical Characterization, Circuit Implementation and Applications Garofalo Ph.D Thesis University of Napoli, 2008-2009.

Walters, E.G., III; Schulte, M.J.; , "Efficient function approximation using truncated multipliers and squarers," Computer Arithmetic, 2005. ARITH-17 2005. 17th IEEE Symposium on , vol., no., pp. 232-239, Jun. 27-29, 2005 doi: 10.1109/ARITH.2005.18.

Wires, K.E.; Schulte, M.J.; Stine, J.E.; , "Variable-correction truncated floating point multipliers," Signals, Systems and Computers, 2000. Conference Record of the Thirty-Fourth Asilomar Conference on , vol. 2, no., pp. 1344-1348 vol. 2, Oct. 29, 2000-Nov. 1, 2000 doi: 10.1109/ACSSC.2000.911211.

\* cited by examiner

Figure 1: Structure of Multiplier Truncation Schemes
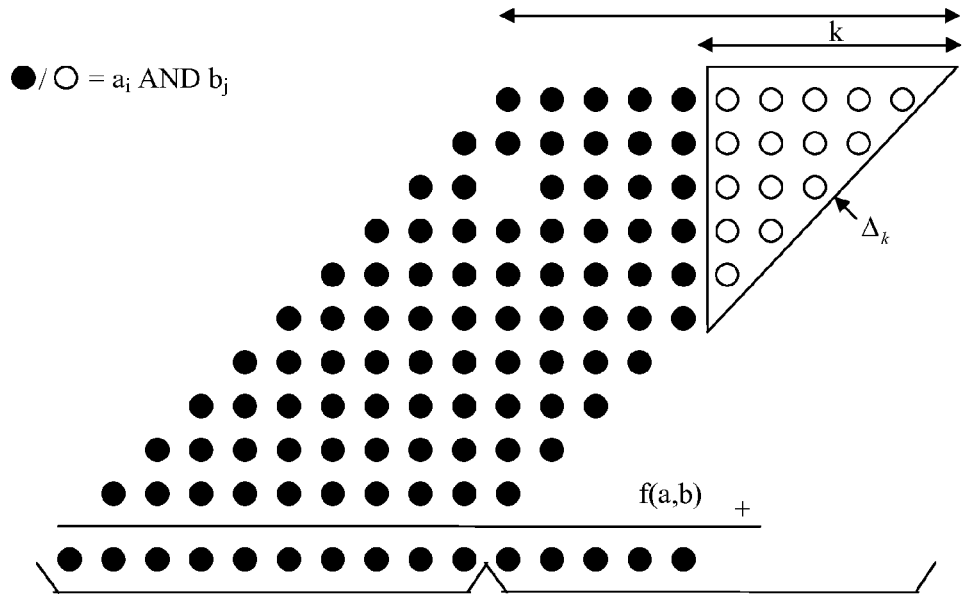
Figure 2: Lossy Multiplier Synthesizer
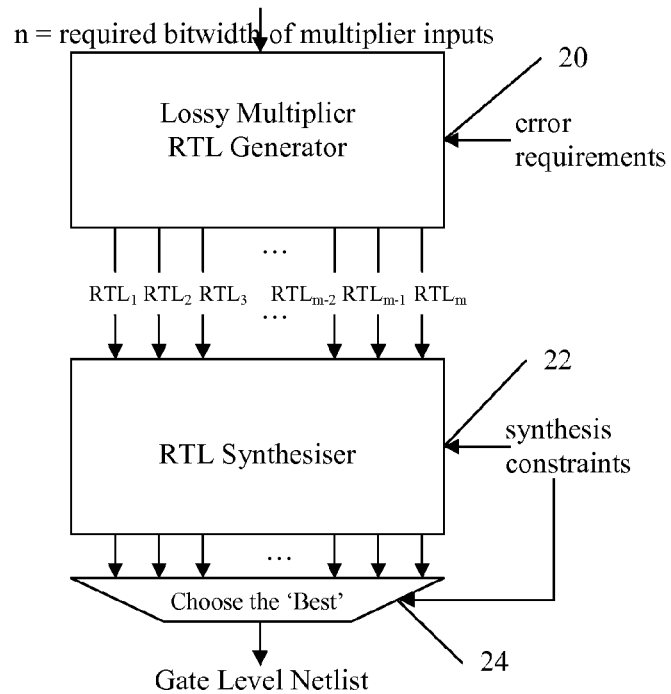

Figure 3: CCT Multiplier Scheme
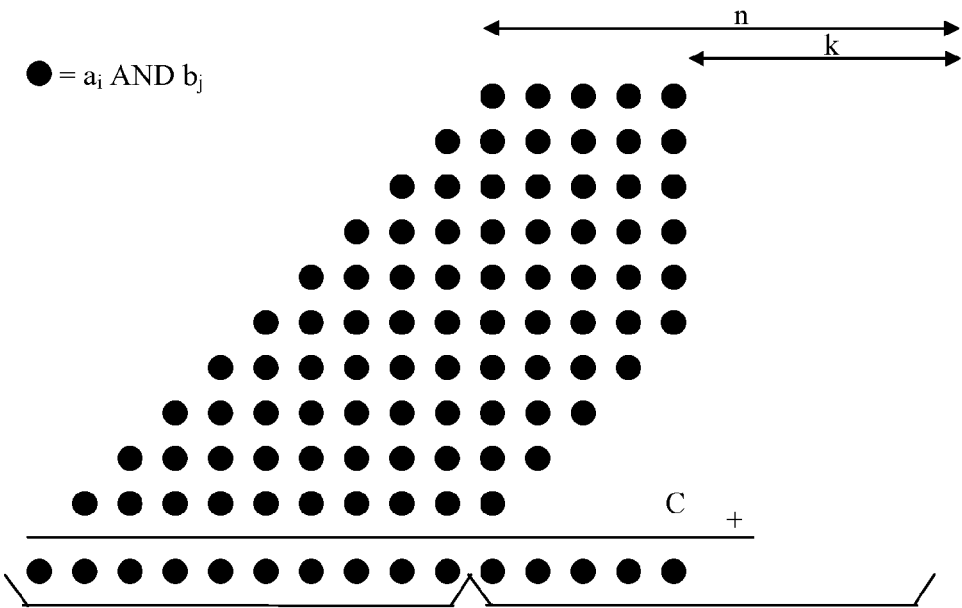
Figure 4: VCT Multiplier Scheme
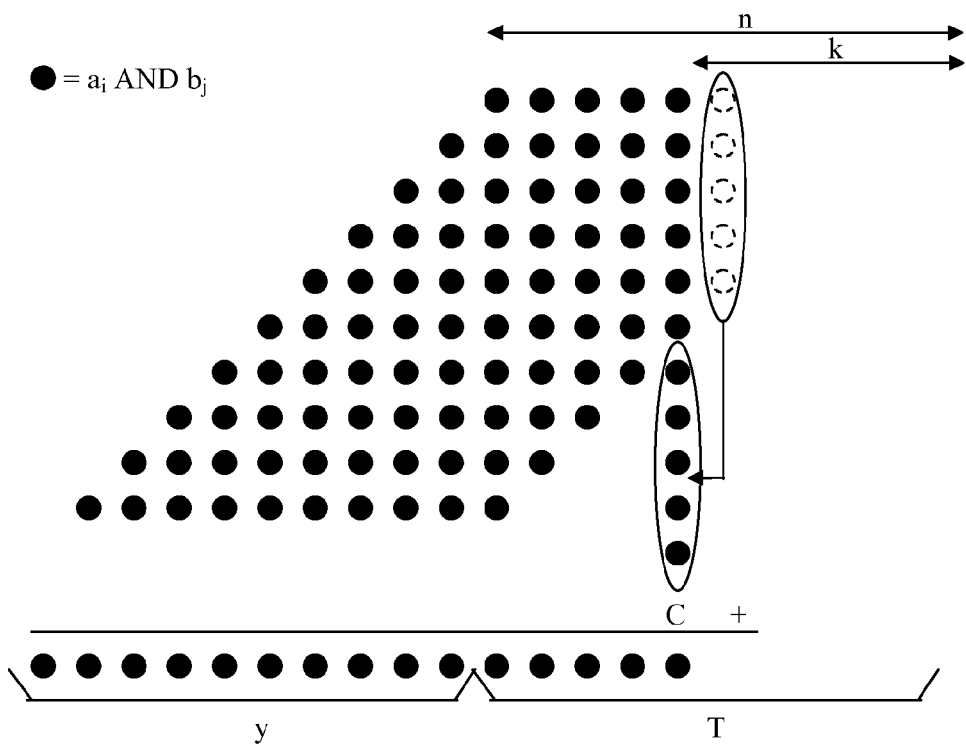

Figure 5: LMS Multiplier Scheme
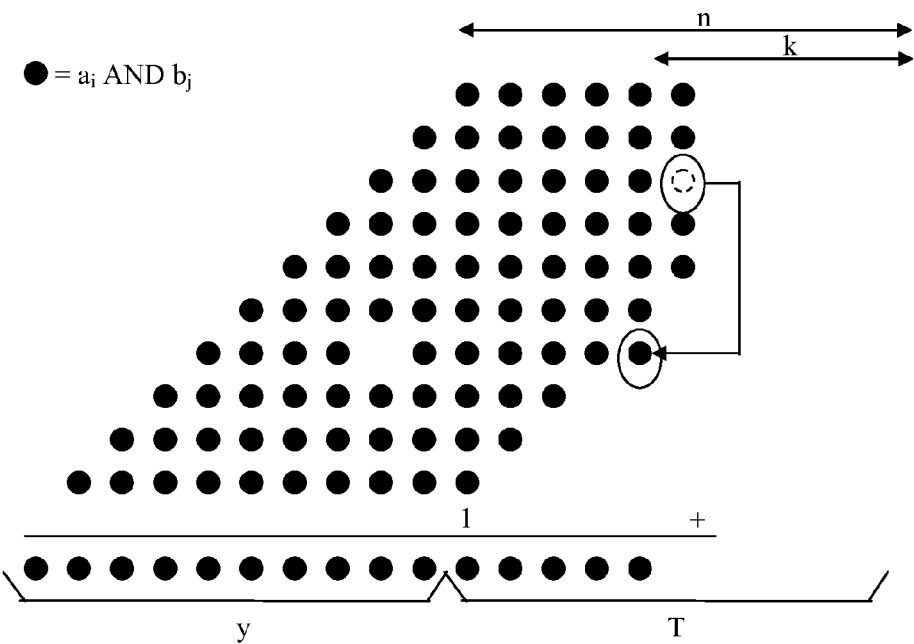
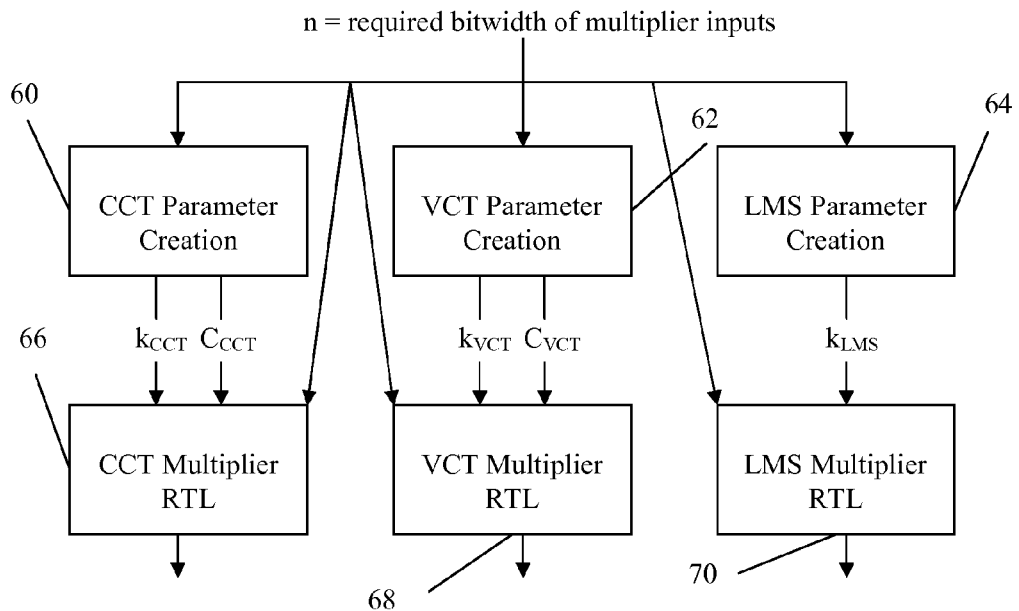
Figure 6: Lossy Multiplier RTL Generator

METHOD AND APPARATUS FOR PERFORMING LOSSY INTEGER MULTIPLIER SYNTHESIS

CROSS REFERENCE TO RELATED APPLICATIONS

This application claims priority from GB App. No. 1111243.0, entitled "Method and Apparatus for Performing Lossy Integer Multiplier Synthesis", filed on Jun. 30, 2011, which is incorporated by reference herein in its entirety for all purposes.

BACKGROUND

1. Field

Some aspects herein relate to methods and apparatus for use in the synthesis and manufacture of integer multipliers that are correct up to a given error tolerance and which perform multiplication as a sum of addends with faithful rounding.

2. Related Art

When modern integrated circuits (IC) designs are produced, these usually start with a high level design specification which captures the basic functionality required but does not include the detail of implementation. High level models of this type are usual written using high level programming language to derive some proof of concept and validate the model, and can be run on general purpose computers or on dedicated processing devices. Once this has been completed and the model has been reduced to register transfer level (RTL) using commercially available tools, or manually, this RTL model can then be optimised to determine a preferred implementation of the design in silicon.

The implementation of some types of multiplier in hardware often involve the determination of a number of partial products which are then summed, each shifted by one bit relative to the previous partial product. Visually this can be considered as a parallelogram array of bits as shown in FIG. 1, where the black circles represent bits.

When a function such as a multiplier is to be produced and manufactured in hardware a circuit to perform the multiplication is derived in Register Transfer Level (RTL) and from this a netlist of gates to produce a hardware circuit is derived. There are many applications in which the full result of a fixed point multiplication is not required, but an appropriately rounded result can be returned. A common approach is to use faithful rounding, which produces a result which is rounded to the required machine precision value above or below the precise result, but not always to the nearest one of these values.

A challenge is to create the most effective trade off between silicon area and error properties. Even for simple truncation schemes there are a wealth of design options and trade offs that can be made. Gathering error statistics for even modestly sized multipliers is extremely time consuming. In order to facilitate high level datapath synthesis capable of searching the design space of single or interconnected truncated multipliers in an acceptable time, analytic formulae must be found. The structure of the majority of truncated multiplication schemes of two n by n bit inputs a and b producing an n bit output y is as follows: truncate the multiplier sum of addends array by removing the value contained in the least significant k columns, denoted $\Delta_k$, prior to the addition of the partial products [1]. A hardware-efficient function of the two multiplicands f(a,b) is then introduced into the remaining columns. Once the resultant array is summed, a further n−k columns are truncated, the result is then the approximation to the multiplication to the required precision. The structure of this general multiplier truncation scheme can be found in FIG. 1. This shows k columns of the array being truncated, and n bits being truncated from the sum of addends to produce a result of the required precision.

This formulation covers all the truncation schemes cited in this paper, as well as trivially incorporating non truncation schemes such as round to nearest, up: k=0 and f=$2^{n-1}$.

The scheme may be summarised algebraically:

$$y = \left\lfloor \frac{ab + 2^k f(a,b) - \Delta_k}{2^n} \right\rfloor a,b,n,k \in N$$

The error introduced by doing so is:

$$\varepsilon = ab - 2^n \left\lfloor \frac{ab + 2^k f(a,b) - \Delta_k}{2^n} \right\rfloor$$

$$\varepsilon = ((ab + 2^k f(a,b) - \Delta_k) \bmod 2^n) + \Delta_k - 2^k f(a,b)$$

$$\varepsilon = T + \Delta_k - 2^k f(a,b)$$

Where T=(ab+$2^k$f(a·b)−$\Delta_K$)mod $2^n$. A design that exhibits faithful rounding is one such that:

$$\forall_{a,b} |\varepsilon| < 2^n$$

Note that if the correct answer is exactly representable then this perfect answer must be returned by a faithfully rounded scheme, otherwise |ε|≥$2^n$. Early truncation schemes considered f being constant, [1] and [2] referred to as Constant Correction Truncated schemes (CCT). Following these, the proposal to make f a function of a and b appeared, termed Variable Correction Truncation (VCT) where the most significant column that is truncated is used as the compensating value for f, [3]. A hybrid between CCT and column promoting VCT has been proposed which only uses some of the partial product bits of the promoted column, termed Hybrid Correction Truncation [4]. Arbitrary functions of the most significant truncated column have been considered along with their linearization, one of these linearisations requires promoting all but the four most extreme partial products bits and adding a constant, called LMS truncation due to the fact it targets the least mean square error, [5] [6]. Forming approximations to the carries produced by $\Delta_k$ has also been put forward, termed carry prediction [7]. Apart from the AND array, a negative two's complement array has also been considered [8]. The particular case of constant multipliers have also been considered [9]. Further modified Booth multipliers have been studied while applying CCT and VCT [10]. Faithfully rounded integer multipliers have also been constructed by truncating, deleting and rounding the multiplication during the array construction, reduction and final integer addition, [11]. In terms of applications, DSP has been the main focus area but they also appear in creating floating point multipliers, where a 1 ulp accuracy is permitted [12]. The evaluation of transcendental functions has also been considered, utilising truncated multipliers as well as truncated squarers [13]. When surveying how the statistics of the error has been analysed, in general, exhaustive simulation is performed or error bounds were given without proof. In the original CCT paper, [1], the maximum error was stated without a full proof. In advanced compensation schemes such as [7], it is commented that it is difficult to know what kind of error is being generated and while exhaustive searches were conducted for n<9, for sizes above this, the only option was to resort to random test vectors. In [14], finding the best compensation function requires searching a space exponential in n and is only feasible for n<13. Further the schemes either find compensating functions heuristically or attempt to minimise the average absolute error or mean square error.

The issue with truncating bits in sum of products operations is that it is complex to determine the effect of truncation and usually error statistics need to be gathered which is time consuming and can lead to many iterations being required during RTL synthesis to produce just one sum of addends unit.

SUMMARY

It is desirable to be able to construct a sum of addends function which minimises hardware implementation cost as the output of RTL synthesis while maintaining a known error profile. In other words, it will be desirable to reduce the complexity of the synthesised logic as much as possible through truncation while maintaining a known error in the thus approximated result, without the time consuming data manipulation required to gather error statistics.

Some aspects provide for the systematic creation of HDL for truncated multipliers which are known a priori to be faithfully rounded, without the need for any simulation or exploration, and as such are amenable to an industry standard synthesis flow. Thus such multipliers may be synthesised and manufactured. Approaches such as [11] are, as such, not viable option as it modifies the multiplier synthesis directly. We also seek the most hardware efficient multiplier structure for a given architecture, so we require the necessary and sufficient conditions for faithfully rounding.

In accordance with one aspect, there is provided a method for deriving in RTL a logic circuit for performing a multiplication as a sum of addends operation with a desired rounding precision comprising the steps of:
a) determining an error requirement to be met for the desired rounding precision;
b) determining a number of columns k to be discarded from the sum of addends and a constant to include in the sum of addends for each of a CCT and VCT implementation of the sum of addends which meets the error requirement, and further determining a number of columns to discard for an LMS implementation of the sum of addends which meets the error requirement;
c) for each of the CCT, VCT and LMS implementations, discarding the said number of columns;
d) for each of the CCT and VCT implementations, including the said constant in the sum of addends;
e) deriving an RTL representation of the sum of addends operation for each of the CCT, VCT and LMS implementations, after steps c) and d) have been performed;
f) synthesizing a logic circuit for each of the respective RTL representations; and,
g) selecting one of the logic circuit for manufacture In accordance with another aspect, there is provided a method for manufacturing in integrated circuit for performing a multiplication as a sum of addends operation with a desired rounding precision comprising the steps of
a) determining an error requirement to be met for the desired rounding precision;
b) determining a number of columns k to be discarded from the sum of addends and a constant to include in the sum of addends for each of a CCT and VCT implementation of the sum of addends which meets the error requirement, and further determining a number of columns to discard for an LMS implementation of the sum of addends which meets the error requirement;
c) for each of the CCT, VCT and LMS implementations, discarding the said number of columns;
d) for each of the CCT and VCT implementations, including the said constant in the sum of addends;
e) deriving an RTL representation of the sum of addends operation for each of the CCT, VCT and LMS implementations, after steps c) and d) have been performed;
f) synthesizing a logic circuit for each of the respective RTL representations; and,
g) selecting one of the logic circuit for manufacture In accordance with a further aspect, there is provided a computer program product which when run on a computing system causes it to perform a method for deriving in RTL a logic circuit for performing a multiplication as sum of addends operation with a desired rounding precision comprising the steps of:
a. determining an error requirement to be met for the desired rounding precision;
b. determining a number of columns k to be discarded from the sum of addends and a constant to include in the sum of addends for each of a CCT and VCT implementation of the sum of addends which meets the error requirement, and further determining a number of columns to discard for an LMS implementation of the sum of addends which meets the error requirement;
c. for each of the CCT, VCT and LMS implementations, discarding the said number of columns;
d. for each of the CCT and VCT implementations, including the said constant in the sum of addends;
e. deriving an RTL representation of the sum of addends operation for each of the CCT, VCT and LMS implementations, after steps c) and d) have been performed;
f. synthesizing a logic circuit for each of the respective RTL representations; and,
g. selecting one of the logic circuit for manufacture

BRIEF DESCRIPTION OF THE DRAWINGS

FIG. 1 shows a sum of addends array used in existing truncated multipliers;

FIG. 2 shows schematically an existing lossy multiplier synthesiser and RTL generator;

FIG. 3 shows a sum of addends array for a CCT multiplier embodying the invention;

FIG. 4 shows a sum of addends array for a VCT multiplier embodying the invention;

FIG. 5 shows a sum of addends array for an LMS multiplier embodying the invention; and, FIG. 6 shows a block diagram of the synthesis of the three multiplier of FIGS. 3, 4 and 5 in parallel

DETAILED DESCRIPTION

The task of creating faithfully rounded multipliers which introduce an error into the synthesis falls under the category of lossy synthesis as opposed to a traditional synthesis which would be classed as lossless. The structure of the proposed lossy multiplier synthesiser is found in FIG. 2. This comprises a lossy multiplier RTL generator to which is provided a known error constraint for the multiplication. This provides a plurality of alternative RTL outputs to an RTL synthesiser 22 which produces a netlist of gates for the manufacture of each RTL output with known synthesis constraints. These netlists of gates are then provided to a selection unit 24 which selects the best of the netlists, which is usually the one which can be manufactured with fewest gates and therefore less silicon.

Embodiments may provide the creation of three faithfully rounded multiplier schemes for the CCT, VCT and LMS architectures (so in this case the error requirement will be faithful rounding). CCT uses a single constant as compensation. Column promoting truncated multiplication (VCT) takes f(a,b) to be the most significant column of $\Delta_k$ (notated $col_{k-1}$). LMS promotes elements from $col_{k-1}$ but leaves the most extreme 4 elements behind as well as introducing a constant of $2^{n-k-1}$. Algebraically we can represent these as:

$$f_{CCT}(a, b) = C$$

$$f_{VCT}(a, b) = C + \sum_{i=0}^{k-1} a_i b_{k-1-i}$$

$$f_{LMS}(a, b) =$$

$$2^{n-k-1} + \sum_{i=2}^{k-3} a_i b_{k-1-i} + \frac{1}{2}(a_0 b_{k-1} + a_1 b_{k-2} + a_{k-2} b_1 + a_{k-1} b_0)$$

Faithful Rounding of CCT Multiplier Schemes

FIG. 3 shows the sum of addends array for a CCT multiplier to implement a AND b with k columns truncated and n bits to discard from the result to produce the desired precision.

In this case $\Delta_k - 2^k f(a,b) = \Delta_k - 2^k C$. To produce bounds on this object we need bounds on $\Delta_k$ (the value of the bits being discarded). When $a_{k-1:0} = b_{k-1:0} = 0$ then $\Delta_k$ is entirely full of zeroes, hence $\Delta_k \geq 0$. When $a_{k-1:0} = b_{k-1:0} = 2^k - 1$ then $\Delta_k$ is entirely full of ones, hence $\Delta_k \leq \sum_{i=0}^{k-1}(2^k - 2^i) = (k-1)2^k + 1$. So we can provide the following tight bounds:

$$-C2^k \leq \Delta_k - 2^k C \leq (k-C-1)2^k + 1$$

T is bounded by $0 \leq T \leq 2^n - 2^k$ and we will show that it can take any value when $\Delta_k$ takes its extreme values. If $a_{k:0} = 2^k$ then $$T = ((a_{n-1:k+1} 2^{k+1} + 2^k)b + C 2^k) \bmod 2^n$$

$$T 2^{-k} - C = (2 a_{n-1:k+1} + 1) b \bmod 2^{n-k}$$

Now $2 a_{n-1:k-1} + 1$ is odd hence coprime to $2^{n-k}$ (hence regardless of the value of C we can always find a and b such that any given T can be achieved when $\Delta_k$ is minimal.

When $\Delta_k$ is maximal $a_{k-1:0} = b_{k-1:0} = 2^k - 1$, under these conditions:

$$T = ((a_{n-1:k} 2^k + 2^k - 1)(b_{n-1:k} 2^k + 2^k - 1) + C 2^k - \max(\Delta_k)) \bmod 2^n$$

$$T 2^{-k} - a_{n-1:k}(2^k - 1) - C - 2^k + k + 1 = b_{n-1:k}(a_{n-1:k} 2^k + 2^k - 1) \bmod 2^{n-k}$$

Now $a_{n-1:k} 2^k + 2^k - 1$ is odd hence coprime to $2^{n-k}$ hence regardless of the value of C we can always find $a_{n-1:k}$ and $b_{n-1:k}$ such that any given T can be achieved when $\Delta_k$ is maximal.

So we can present the following tight bounds for the error of the CCT scheme:

$$-C2^k \leq \epsilon_{CCT} \leq 2^n - (C - k + 2)2^k + 1$$

Given these bounds we work out the necessary and sufficient conditions for the faithful rounding of CCT multipliers:

$$|\epsilon_{CCT}| < 2^n \Leftrightarrow 2^{n-k} < C < k - 2$$

This can then be used to derive a constant to add to include in a truncated sum of addends array for k columns truncated Faithful Rounding of VCT Multiplier Schemes FIG. 4 shows the sum of addends array for a VCT multiplier. In this, the constant to include in the least significant column of the sum of addends is the bits of the most significant of the truncated columns, shifted by one bit. Thus a total of T columns are truncated from the result, giving a y bit result.

In this case $\Delta_k - 2^k f(a,b) = \Delta_k - 2^k col_{k-1} - 2^k C$. We will provide tight bounds on this object.

We first claim that $\mu = \Delta_k - 2^k col_{k-1}$ takes its maximal value when $col_{k-1} = 0$ and $col_{k-2}$ is an alternating binary sequence. To see that $col_{k-1} = 0$, consider that $\mu$ can be written as (for an arbitrary function g):

$$\mu = 2^j a_j (-2^{k-1-j} b_{k-1-j} + b_{k-2-j:0}) + g(a_{k-1:j+1}, a_{j-1:0}, b)$$

If we set $j = 0$ in this equation and maximise $\mu$ over $a_0$ and $b_{k-1}$ we find $a_0 = 1$ and by symmetry $b_0 = 1$. Then, in the general case, if we maximise $\mu$ over $a_j$ and $b_{k-1-j}$ keeping in mind that $b_{k-2-j} > 0$ as $b_0 = 1$ then we find that $\mu$ is maximised when $a_j \neq b_{k-1-j}$ and hence $col_{k-1} = 0$.

To see that $col_{k-2}$ is an alternating binary sequence consider the case when there are two adjacent zeroes in $col_{k-2}$ so we have a location where:

$$a_{j-1} b_{k-j} a_{j-1} b_{k-j-1} = 0\ 0$$

$$a_j b_{k-j-1} a_j b_{k-j-2} = 0\ 0$$

Assuming that $a_j \neq b_{k-1-j}$ for all j and, by symmetry, we may assume $a_{j-1} = 1$ solving the above equations means $a_{j:j-1} = "11"$ and $b_{k-j:k-j-2} = 0$. If however we set $a_{j:j-1} = "01"$ and $b_{k-j:k-j-2} = "010"$ we would actually increase $\mu$ by:

$$2^{k-2} + 2^{k-j-1} a[j-2:0] - 2^j b[k-j-3:0] >$$
$$2^{k-2} + 2^{k-j-1} a[j-2:0] - 2^j (2^{k-j-2} - 1) = 2^j + 2^{k-j-1} a[j-2:0] > 0$$

Hence when $\mu$ is maximal, adjacent zeroes never appear in $col_{k-2}$. Further if adjacent ones were to appear in $col_{k-2}$ then there would be a one in column $col_{k-1}$, which contradicts the previous assumption. Conclude that $col_{k-1} = 0$ and $col_{k-2}$ is an alternating binary sequence when $\mu$ is maximal. These two conditions uniquely determine a and b, from which can be calculated the bounds:

$$\mu \leq \frac{(3k-2)2^{k-1} + (-1)^k}{9}$$

The lower bound on $\mu$ is achieved when $a_j = b_{k-1-j}$ for all j, $a_0 = b_0$ and the interior of a and b are alternating binary sequences. We will demonstrate each of these properties in turn.

First recall that we can write for some function g:

$$\mu = 2^j a_j (-2^{k-1-j} b_{k-1-j} + b_{k-2-j:0}) + g(a_{k-1:j+1}, a_{j-1:0}, b)$$

If $a_j \neq b_{k-1-j}$ and $a_j = 1$ then $\mu$ can be decreased by $2^{k-1-j} - b_{k-2-j:0} > 0$ by setting $b_{k-1-j} = 1$, hence $\mu$ being minimal implies $a_j = b_{k-1-j}$ for all j.

Secondly if $a_0 = b_{k-1} = 0$ then $\mu$ can be decreased by $2^{k-1} - b_{k-2:0} > 0$ by setting $a_0 = 1$.

Finally we need to show that the interior of a and b are alternating binary sequences when $\mu$ is minimal. First we introduce some notation:

$$\gamma(z) = \frac{1}{2^{k-1}} \mu(a = x_0 x_1 \ldots x_{m-1} z_{p-1} \ldots z_1 z_0 y_{q-1} \ldots y_1 y_0)$$
$$= f(z) + g(z)X + h(z)Y + \gamma(0)$$

Where $X = x_{m-1} \ldots x_1 x_0 / 2^m < 1$ and $Y = y_{q-1} \ldots y_1 y_0 / 2^q < 1$, we will then show various strings within a never occur:

$\gamma(010) - \gamma(000) = (X+Y)/2 - 1 < 0$ so "000" never occurs $\gamma(101) - \gamma(111) = -(X+Y) < 0$ when $k > 3$ so "111" never occurs If "1001" were feasible then $\gamma(1001) \leq \gamma(1010), \gamma(0101), \gamma(1011), \gamma(1101)$ this would imply $0 \leq 1 + X - 4Y$ $0 \leq 1 + Y - 4X$ $0 \leq -1 + X + 2Y$ $0 \leq -1 + Y + 2X$ But the only solution to this is $X = Y = 1/3$ which is not possible given that X and Y are finite binary numbers. Hence "1001" never occurs.

If "0110" were feasible then $\gamma(0110) \leq \gamma(0101), \gamma(1010), \gamma(0010), \gamma(0100)$ this would imply:

$0 \leq -2 + 4Y - X$ $0 \leq -2 + 4X - Y$ $0 \leq 2 - 2X - Y$ $0 \leq 2 - 2Y - X$ But the only solution to this is $X = Y = 2/3$ which is not possible given that X and Y are finite binary numbers. Hence "0110" never occurs.

The fact that these strings never occur implies that the interior of a and b are alternating binary sequences. The fact that $a_j = b_{k-1-j}$ for all j, $a_0 = b_0$ and the interior of a and b are alternating binary sequences uniquely determine a and b, from which can be calculated the bounds:

$$\mu \leq \frac{(3k+7)2^{k-1} + (-1)^k}{9}$$

We are now in a position to tightly bound $\Delta_k - 2^k \text{col}_{k-1} - 2^k C$:

$$-\frac{2^{k-1}(3k + 18C + 7) + (-1)^k}{9} \leq$$
$$\Delta_k - 2^k \text{col}_{k-1} - 2^k C \leq \frac{2^{k-1}(3k - 18C - 2) + (-1)^k}{9}$$

We will now show that T can take any value whenever $\mu$ is extreme. If $\mu$ is maximal then $\text{col}_{k-1} = 0$ and $\text{col}_{k-2}$ is an alternating binary sequence. These conditions uniquely determine $a_{k-1:0}$ and $b_{k-1:0}$ up to swapping. When k is odd these conditions imply $a_{k-1:0} = (2^{k-1}1)/3$ and $b_{k-1:0} = (2^k+1)/3$, T is then defined by:

$$T = \left(\left(a_{n-1:k} 2^k + \frac{2^{k-1} - 1}{3}\right)\left(b_{n-1:k} 2^k + \frac{2^k + 1}{3}\right) + C 2^k - \max(\mu)\right) \mod 2^n$$

$$T 2^{-k} - C - \frac{2^k - 3k + 1}{18} - a_{n-1:k} \frac{2^k + 1}{3} =$$
$$b_{n-1:k}\left(a_{n-1:k} 2^k + \frac{2^{k-1} - 1}{3}\right) \mod 2^{n-k}$$

Now $a_{n-1:k} 2^k + (2^{k-1} - 1)/3$ is odd hence coprime to $2^{n-k}$ (hence regardless of the value of C we can always find a and b such that any given T can be achieved when $\mu$ is maximal and k is odd. Similarly when k is even we have $a_{k-1:0} = b_{k-1:0} = (2^{k-1})/3$ or $a_{k-1:0} = b_{k-1:0} = (2^{k-1}+1)/3$ and the argument proceeds in an identical manner. Hence we conclude that regardless of the value of C we can always find a and b such that any given T can be achieved when $\mu$ is maximal.

If $\mu$ is minimal then $a_0 = b_0 = 1$, $a_j = b_{k-1-j}$ for all j and the interior of $\text{col}_{k-1}$ is an alternating binary sequence. These conditions uniquely determine $a_{k-1:0}$ and $b_{k-1:0}$ up to swapping. When k is even these conditions imply $a_{k-1:0} = (5*2^{k-1} - 1)/3$ and $b_{k-1:0} = (2^{k+1}+1)/3$, T is then defined by:

$$T =$$
$$\left(\left(a_{n-1:k} 2^k + \frac{5 * 2^{k-1} - 1}{3}\right)\left(b_{n-1:k} 2^k + \frac{2^{k+1} + 1}{3}\right) + C 2^k - \min(\mu)\right) \mod 2^n$$

$$T 2^{-k} - C - \frac{5 * 2^{k+1} + 3k + 8}{18} - a_{n-1:k} \frac{2^{k+1} + 1}{3} =$$
$$b_{n-1:k}\left(a_{n-1:k} 2^k + \frac{5 * 2^{k-1} - 1}{3}\right) \mod 2^{n-k}$$

Now $a_{n-1:k} 2^k + (5*2^{k-1} - 1)/3$ is odd hence coprime to $2^{n-k}$ hence regardless of the value of C we can always find a and b such that given T can be achieved when $\mu$ is minimal and k is even. Similarly when k is odd we have $a_{k-1:0} = b_{k-1:0} = (2^{k+1} - 1)/3$ or $a_{k-1:0} = b_{k-1:0} = (5*2^{k-1}+1)/3$ and the argument proceeds in an identical manner. Hence we conclude that regardless of the value of C we can always find a and b such that any given T can be achieved when $\mu$ is minimal.

Given T can take any value when $\mu$ is extreme allows us to state the error the VCT scheme:

$$-\frac{2^{k-1}(3k + 18C + 7) + (-1)^k}{9} \leq \varepsilon_{VCT} \leq 2^n + \frac{2^{k-1}(3k - 18C - 20) + (-1)^k}{9}$$

Given these bounds we work out the necessary and sufficient conditions for the faithful rounding of VCT multipliers:

$|\varepsilon_{VCT}| < 2^n \Leftrightarrow 3 * 2^{n-k+1} - k - 2 < 6C < k - 7$

Thus for a given error we can derive a number of columns k to discard from the sum of addends and a constant C to add from the most significant columns discarded Faithful Rounding of LMS Multiplier Schemes FIG. 5 shows the sum of addends array for a for an LMS multiplier. In this, some of the bits from the least significant non-truncated column is shifted to the next least significant column for inclusion in the sum of addends The error bounds on this scheme were first reported in [16] and can be summarised by:

$$-2^{n-1} - \frac{1}{9}(2^{k-4}(24k - 19 + 3(-1)^k) - 3 + 4(-1)^k) \leq$$
$$\varepsilon_{LMS} \leq \frac{2^{n-k-1}}{9}(2^k(3k+1) + 8(-1)^k)$$

As stated in [16], in absolute value, the most negative error dominates. From this condition we can derive the necessary and sufficient condition for faithful rounding of the LMS scheme:

$$|\varepsilon_{LMS}|<2^n \Leftrightarrow 9*2^{n-k+1}<6k+3+(-1)^k$$

Lossy Multiplier RTL Generator

Now we have the necessary and sufficient conditions for faithful rounding of the CCT, VCT and LMS truncated multiplier schemes we can show how to construct a lossy multiplier RTL generator. In each case we want to choose the value of k and C which minimises the hardware costs. The cost of the hardware is directly related to the number of bits that need to be summed. So we wish to maximise the size of k and minimise the number of ones in the binary expansion of C while maintaining the property that the multiplier is faithfully rounded. So we can create the following algorithms which define the conditions which are required to achieve this for the known error bounds:

Where the parameters are calculated as follows:

$$k_{CCT} = \max(k : \exists C \text{ s.t. } 2^{n-k} > C > k-2)$$
$$= \max(k : 2^n > (k-1)2^k)$$
$$C_{CCT} = \min Hamm(C : 2^{n-k_{CCT}} > C > k_{CCT} - 2)$$
$$k_{VCT} = \max(k : \exists C \text{ s.t. } 3*2^{n-k+1} - k - 2 > 6C > k - 7)$$
$$C_{VCT} = \min Hamm(C : 3*2^{n-k_{VCT}+1} - k_{VCT} - 2 > 6C > k_{VCT} - 7)$$
$$k_{LMS} = \max(k : 2^{n-k+1} > 6k + 3 + (-1)^k)$$

Where minHamm(x:condition) calculates the smallest value within the set of all x that meet the condition with smallest Hamming weight. So as an embodiment of the invention consider the case where n=8. The Lossy Multiplier RTL Generator will first calculate all the relevant parameters:

$k_{CCT}=5$ $C_{CCT}=4$ $k_{VCT}=6$ $C_{VCR}=0$ $k_{LMS}=6$

And then produce the CCT, VCT and LMS RTL which use those parameters. The lossy synthesiser will then use standard RTL synthesis to produce the gate level netlists. From which the netlist which exhibits the best quality of results according to the synthesis constraints can be chosen.

Thus the steps taken to achieve this are:
1. Determine a faithful rounding precision and error bounds required for a multiplier.
2. Determine k and C for a CCT implementation.
3. Determine k and C for a VCT implementation.
4. Determine k for an LMS implementation.
5. Derive an RTL representation of each of the CCT, VCT and LMS implementations.
6. Use RTL synthesis to produce gate level netlists for each of the implementations.
7. Select the netlist which gives the best implementation according to desired factors such as number of gates, amount of silicon, power consumption, speed of operation.
8. Manufacture the thus selected netlist as a multiplier in an integrated circuit.

In the embodiments described above the derivation of k and C and the RTL generation and synthesis can take place on a general purpose computer loaded with appropriate software. Alternatively, it can take place on a programmable RTL generator loaded with appropriate software.

Alternative Implementations

1) In the embodiment above it was assumed that error requirement was faithful rounding. The error bounds can be used to calculate the necessary and sufficient conditions where a different error requirement is needed. Say we had the generic requirement:

$$\forall a,b |\varepsilon|<\alpha 2^n$$

Where $\alpha > \frac{1}{2}$ this would then give us the following necessary and sufficient conditions on k and C for this to hold:

$$|\varepsilon_{CCT}| < \alpha 2^n \Leftrightarrow \alpha 2^{n-k} > C > (1-\alpha)2^{n-k} + k - 2$$

$$|\varepsilon_{VCT}| < \alpha 2^n \Leftrightarrow$$
$$9\alpha 2^{n-k} - \frac{3}{8}k - \frac{17}{8} - \frac{(-1)^k}{2^{k+2}} > C > (1-\alpha)2^{n-k-1} - \frac{k}{3} - \frac{10}{9} + \frac{(-1)^k}{9*2^{k+2}}$$

$$|\varepsilon_{LMS}| < \alpha 2^n \Leftrightarrow (2\alpha - 1)2^{n-k+3} > 24k - 19 + 3(-1)^k + \frac{4(-1)^k - 3}{2^{k-4}}$$

So the parameter creation part of the Lossy Multiplier RTL Generator will take $\alpha$ as an extra input. The Lossy Multiplier RTL Generator can be designed to cope with more complex error constraints and is not limited to faithful rounding 2) The Lossy Multiplier RTL Generator can also produce an error report detailing the worst case error, worst case error vectors and other properties of the error.

In the case of CCT it can be shown that when $2C-k+1<2^{n-k}$ there are $2^{n-k}$ worst case error vectors, these are constrained by:

$$a_{k-1:0}=b_{k-1:0}=2^k-1$$

$$b_{n-1:k}=-p(2^k+C-k+a_{n-1:k}(2^k-1)) \bmod 2^{n-k}$$

Where $pa=1 \bmod 2^{n-k}$. Otherwise there are $(k+x+1)2^{n-1}$ worst case error vectors where x is the number of times 2 divides C, for m=0, 1, 2 ..., k+x these are constrained by:

$$a_m=1 b_{k+x-m-1:0}=a_{m-1:0}=0$$

$$a_{n-k-x+m-1:m}b_{n-m-1:k+x-m}+C/2^x=0 \bmod 2^{n-k-x}$$

In the case of VCT it can be shown that there are always $2^{n-k+1}$ worst case error vectors which are constrained by:

$$b_{n-1:k}=-p(C+X/18+a_{n-1:k}b_{k-1:0}) \bmod 2^{n-k}$$

Where $pa=1 \bmod 2^{n-k}$ and $a_{k-1:0}$, $b_{k-1:0}$ and X are defined in Table 1.

TABLE 1

| X values for VCT worst case error vectors | | | | |
|---|---|---|---|---|
| $4C + 3 < 2^{n-k+1}$ | k odd? | $a_{k-1:0}$ | $b_{k-1:0}$ | X |
| Yes | Yes | 00101...10101 | 01010...01011 | $2^k$-3k + 19 |
| Yes | Yes | 01010...01011 | 00101...10101 | $2^k$-3k + 19 |
| Yes | No | 01010...10101 | 01010...10101 | $2^{k+1}$-3k + 16 |
| Yes | No | 00101...01011 | 00101...01011 | $2^{k-1}$-3k + 22 |
| No | Yes | 10101...10101 | 10101...10101 | $2^{k+3}$ + 3k − 1 |
| No | Yes | 11010...01011 | 11010...01011 | $2^{k-1}$25 + 3k + 17 |
| No | No | 11010...10101 | 10101...01011 | $2^{k+1}$5 + 3k + 8 |
| No | No | 10101...01011 | 11010...10101 | $2^{k+1}$5 + 3k + 8 |

3) Instead of simply an n by n multiplication returning an n bit answer, we can generalize this to an n by m multiplication returning a p bit answer. In the case of CCT it can be shown that the necessary and sufficient conditions for faithfully rounding are:

$$|\varepsilon_{CCT}| < 2^{n+m-p} \Leftrightarrow \begin{array}{c} 2^{n+M-p-k} > C > \min(n, m, k) - 2 \\ k \leq \min(\max(n, m), n + m - p) \end{array}$$

4) Integer multiplication is used in many other datapath components, for example they are central to floating point multipliers. For example it can be shown that the following code will result used as the integer part of a floating point multiplier will be correct to 1 unit in the last place if truncmult(A,B,n+2) returns a faithful rounding of the top n+2 bits of product of A and B:

$$A[n:0]=(1<<n)+\mathrm{mant}a$$

$$B[n:0]=(1<<n)+\mathrm{mant}b$$

$$C[n+1:0]=\mathrm{truncmult}(A,B,n+2)$$

$$\mathrm{mantout}[n-1:0]=C[n+1]?C[n:1]:C[n-1:0]$$

FIG. 6 shows schematically how the method described above can be implemented in the RTL generator of FIG. 2. For a given multiplier, a required bitwidth n for a rounding accuracy is supplied in parallel to each of a CCT parameter creating unit 60, a VCT parameter creation unit 62, and an LMS parameter creation unit 64. These also receive the error requirements as shown in FIG. 2 and using the create respectively C and k for the VCT and CCT units and k for the LMS unit. These values are then supplied to respective CCT, VCT and LMS RTL synthesis units (66, 68, 70) which produces a netlist for each scheme. This is passed to the selection unit 24 of FIG. 2 which is controlled to select the best netlist for manufacture.

As discussed above, all this can be implemented in dedicated RTL generators or in programmable generators or in software on a general purpose computer. Once the best netlist has been selected, it can be incorporated in the design of an integrated circuit.

BIBLIOGRAPHY

[1] M. J. Schulte and J. Earl E. Swartzlander, "Truncated multiplication with correction constant," in Workshop on VLSI Signal Processing, vol. VI, no. 20-22, October 1993, pp. 388-396.
[2] S. S. Kidambi, F. EI-Guibaly, and A. Antoniou, "Area-efficient multipliers for digital signal processing applications," IEEE Transactions on Circuits and Systems II: Analog and Digital Signal Processing, vol. 43, no. 2, pp. 90-95, February 1996.
[3] E. J. King and J. Earl E. Swartzlander, "Data-dependent truncation scheme for parallel multipliers," in Thirty-First Asilomar Conference on Signals, Systems & Computers, vol. 2, no. 2-5, November 1997, pp. 1178-1182.
[4] J. E. Stine and O. M. Duverne, "Variations on truncated multiplication," in Euromicro Symposium on Digital System Design, September 2003, pp. 112-119.
[5] N. Petra, D. De Caro, V. Garofalo, E. Napoli, and A. Strollo, "Truncated binary multipliers with variable correction and minimum mean square error," Circuits and Systems I: Regular Papers, IEEE Transactions on, vol. 57, no. 6, pp. 1312-1325, june 2010.
[6], "Design of fixed-width multipliers with linear compensation function," Circuits and Systems I: Regular Papers, IEEE Transactions on, vol. 58, no. 5, pp. 947-960, may 2011.
[7] R. Michard, A. Tisserandt, and N. Veyrat-Charvillon, "Carry predicition and selection for truncated multiplication," in IEEE Workshop on Signal Processing Systems Design and Implementation, 2006, pp. 339-344.
[8] H. Park and J. Earl E. Swartzlander, "Truncated multiplications for the negative two's complement number system," in 49th IEEE International Midwest Symposium on Circuits and Systems, 2006, pp. 204-208.
[9] S.-M. Kim, J.-G. Chung, and K. K. Parhi, "Low error fixed-width csd multiplier with efficient sign extension," IEEE Transactions on Circuits and Systems II: Analog and Digital Signal Processing, vol. 50, no. 12, pp. 984-993, 2003.
[10] T.-B. Juang and S.-F. Hsiao, "Low-error carry-free fixed-width multipliers with low-cost compensation circuits," IEEE Transactions on Circuits and Systems II, vol. 52, no. 6, pp. 299-303, June 2005.
[11] H.-J. Ko and S.-F. Hsiao, "Design and application of faithfully rounded and truncated multipliers with combined deletion, reduction, truncation, and rounding," Circuits and Systems II: Express Briefs, IEEE Transactions on, vol. 58, no. 5, pp. 304-308, may 2011.
[12] K. E. Wires, M. J. Schulte, and J. E. Stine, "Variable-correction truncated floating point multipliers," in Thirty-Fourth Asilomar Conference on Signals, Systems and Computers, vol. 2, 2000, pp. 1344-1348.
[13] E. G. W. III and M. J. Schulte, "Efficient function approximation using truncated multipliers and squarers," in 17th IEEE Symposium on Computer Arithmetic, June 2005, pp. 232-239.
[14] A. Strollo, N. Petra, and D. DeCaro, "Dual-tree error compensation for high performance fixed-width multipliers," Circuits and Systems II: Express Briefs, IEEE Transactions on, vol. 52, no. 8, pp. 501-507, aug. 2005.
[15] V. Garofalo, N. Petra, and E. Napoli, "Analytical calculation of the maximum error for a family of truncated multipliers providing minimum mean square error," Computers, IEEE Transactions on, vol. PP, no. 99, p. 1, 2010.
[16] V. Garofalo, "Truncated binary multipliers with minimum mean square error: analytical characterization, circuit implementation and applications," Ph.D. dissertation.

The invention claimed is:

1. A non-transitory machine readable medium storing instructions for causing a machine to perform a method for deriving a Register Transfer Language (RTL) representation for a logic circuit for performing a multiplication as a sum of addends operation with a desired rounding precision, the method comprising:

determining an error requirement to be met for the desired rounding precision;

determining a number of columns k to be discarded from the sum of addends and a constant to include in the sum of addends for each of a CCT and VCT implementation of the sum of addends which meets the error requirement, and further determining a number of columns to discard for an LMS implementation of the sum of addends which meets the error requirement;

discarding columns according to the determined respective number of columns for each of the CCT, VCT and LMS implementations;

including the constant in the sum of addends for each of the CCT and VCT implementations;

deriving an RTL representation of the sum of addends operation for each of the CCT, VCT and LMS implementations, after performing the discarding and the including of the constant;

synthesizing a respective netlist for each of the respective RTL representations; and selecting one of the synthesized netlists for production of a logic circuit.

2. A non-transitory machine readable medium storing instructions for causing a machine to perform a method for deriving RTL for a logic circuit according to claim 1, wherein k and C are selected by maximizing the size of k and minimizing the number of binary ones in the binary expansion of C.

3. A non-transitory machine readable medium storing instructions for causing a machine to perform a method for deriving RTL for a logic circuit according to claim 2, wherein $k_{CCT}$ is a minimum hamming weight for all possible values of C that satisfy the condition that C be less than $2^{(n-kCCT)}$ and greater than ($k_{CCT}-2$).

4. A non-transitory machine readable medium storing instructions for causing a machine to perform a method for deriving RTL for a logic circuit according to claim 1, wherein the number of columns k for the CCT ($k_{CCT}$) implementation is a maximum of all values of k that satisfy the condition that $2^n$ is greater than $(k-1)2^k$.

5. A non-transitory machine readable medium storing instructions for causing a machine to perform a method for deriving RTL for a logic circuit according to claim 1, wherein the number of columns k for the VCT implementation is a maximum of all values of k that satisfy the condition that $2^n$ is greater than $(k-1)2^k$.

6. A non-transitory machine readable medium storing instructions for causing a machine to perform a method for deriving RTL for a logic circuit according to claim 1, wherein the number of columns k for the VCT implementation and the constant for the VCT implementation are selected as $k_{VCT}=\max(k:\exists C \text{ s.t. } 3*2^{n-k+1}-k-2>6C>k-7)$ and $C_{VCT}=\min \text{hamm}(C:3*2^{n-k_{VCT}+1}-k_{VCT}-2>6C>k_{VCT}-7)$.

7. A non-transitory machine readable medium storing instructions for causing a machine to perform a method for deriving RTL for a logic circuit according to claim 1, further comprising manufacturing an integrated circuit with the selected netlist.

8. A non-transitory machine readable medium storing instructions for causing a machine to perform a method for deriving RTL for a logic circuit according to claim 1, further comprising maximizing k for both CCT and VCT implementations.

9. A non-transitory machine readable medium storing instructions for causing a machine to perform a method for deriving RTL for a logic circuit according to claim 1, further comprising providing an additional error constraint on the selection of k and C parameters for one or more of the CCT, VCT and LMS implementations.

10. A non-transitory machine readable medium storing instructions for causing a machine to perform a method for deriving RTL for a logic circuit according to claim 1, further comprising producing an error report including a worse case error for the resulting lossy multiplier netlist.

11. A non-transitory machine readable medium storing instructions for causing a machine to perform a method for deriving RTL for a logic circuit according to claim 1, wherein for n=8, k for the CCT implementation is 5, C for the CCT implementation is 4, k for the VCT implementation is 6, C for the VCT implementation is 0, and k for the LMS implementation is 6.

12. A non-transitory machine readable medium storing machine executable instructions for a method, comprising:

determining an error requirement to be met for the desired rounding precision;

determining a number of columns k to be discarded from the sum of addends and a constant to include in the sum of addends for each of a CCT and VCT implementation of the sum of addends which meets the error requirement, and further determining a number of columns to discard for an LMS implementation of the sum of addends which meets the error requirement;

for each of the CCT, VCT and LMS implementations, discarding columns according to the determined number of columns;

for each of the CCT and VCT implementations, including the constant in the sum of addends;

deriving an RTL representation of the sum of addends operation for each of the CCT, VCT and LMS implementations, after performing the discarding and including of the constant;

synthesizing a respective netlist for each of the respective RTL representations; and selecting one of the synthesized netlists.

13. The machine readable medium of claim 12, wherein the method further comprises selecting k and C for the VCT implementation by maximizing the size of k and minimizing the number of binary ones in the binary expansion of C.

14. The machine readable medium of claim 12, wherein the method further comprises selecting k and C for the CCT implementation by maximizing the size of k and minimizing the number of binary ones in the binary expansion of C.

15. The machine readable medium of claim 12, wherein the number of columns k for the CCT ($k_{CCT}$) implementation is a maximum of all values of k that satisfy the condition tha*2t $2^n$ is greater than $(k-1)2^k$.

16. The machine readable medium of claim 15, wherein according to claim 2, wherein $k_{CCT}$ is a minimum hamming distance for all possible values of C that satisfy the condition that C be less than $2^{(n-kCCT)}$ and greater than ($k_{CCT}-2$).

17. The machine readable medium of claim 12, wherein the number of columns k for the VCT implementation ($k_{vct}$) is a maximum of all values of k that satisfy the condition that $2^n$ is greater than $(k-1)2^k$.

18. The machine readable medium of claim 12, wherein $k_{vct}$ and the constant for the VCT ($C_{VCT}$) implementation are selected as $k_{VCT}=\max(k:\exists C \text{ s.t. } 3*2^{n-k+1}-k-2>6C>k-7)$ and $C_{VCT}=\min \text{hamm}(C:3*2^{n-k_{VCT}+1}-k_{VCT}-2>6C>k_{VCT}-7)$.

19. The machine readable medium of claim 12, further comprising manufacturing an integrated circuit with the selected netlist.

20. The machine readable medium of claim 12, further comprising maximizing k for both CCT and VCT implementations.

* * * * *